United States Patent
Kadlec et al.

(10) Patent No.: US 11,842,871 B2
(45) Date of Patent: Dec. 12, 2023

(54) LOW VOLTAGE MEMS RELAY FILLED WITH ALTERNATIVE GAS MIXTURE TO $SF_6$

(71) Applicant: EATON INTELLIGENT POWER LIMITED, Dublin (IE)

(72) Inventors: Stanislav Kadlec, Prague (CZ); Sandy Omar Jimenez Gonzalez, Coraopolis, PA (US); Venkat raman Thenkarai Narayanan, Prague (CZ); Mykhailo Gnybida, Prague (CZ); Christian Ruempler, Bonn (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/475,746

(22) Filed: Sep. 15, 2021

(65) Prior Publication Data

US 2023/0082203 A1    Mar. 16, 2023

(51) Int. Cl.
*H01H 59/00* (2006.01)
*B81B 3/00* (2006.01)
*H01H 29/06* (2006.01)

(52) U.S. Cl.
CPC ....... *H01H 59/0009* (2013.01); *B81B 3/0024* (2013.01); *H01H 29/06* (2013.01); *B81B 2201/01* (2013.01)

(58) Field of Classification Search
CPC .. H01H 59/0009; H01H 29/06; B81B 3/0024; B81B 2201/01
See application file for complete search history.

(56) References Cited

U.S. PATENT DOCUMENTS

| | | | |
|---|---|---|---|
| 2005/0104693 A1 | 5/2005 | Younger | |
| 2008/0211347 A1* | 9/2008 | Wright | H01H 59/0009 310/318 |
| 2018/0197656 A1* | 7/2018 | Biquez | H01H 33/22 |
| 2021/0074494 A1* | 3/2021 | Baron | H01H 33/664 |
| 2022/0254586 A1* | 8/2022 | Ehrlich | H01H 33/022 |

FOREIGN PATENT DOCUMENTS

EP    2056320 A2 *  5/2009 ............. H01H 29/28

OTHER PUBLICATIONS

Tyco Electronics Axicom Ltd. "RelayTechnology" [Online]. Available: http://www.farnell.com/datasheets/105262.pdf., 153 pp.

(Continued)

*Primary Examiner* — Bernard Rojas
(74) *Attorney, Agent, or Firm* — Eckert Seamans Cherin & Mellott, LLC

(57) ABSTRACT

The switch contacts of a MEMS relay for a circuit interrupter are coated with a thin layer of liquid metal, and the MEMS relay is disposed in a sealed enclosure containing a gas medium. The gas medium provides an environmentally desirable alternative to sulfur hexafluoride ($SF_6$), prevents oxidation of the liquid metal coating the relay switch contacts, and has sufficient dielectric strength in order to prevent current flow after separation of the switch contacts.

20 Claims, 4 Drawing Sheets

(56) References Cited

OTHER PUBLICATIONS

S. Tian, X. Zhang, Y. Cressault, J. Hu, B. Wang, S. Xiao, Y. Li and N. Kabbaj, "Research status of replacement gases for SF6 in power industry," AIP Advances, vol. 10, No. 5, Published Online: May 7, 2020, 35 pp.

B. Pan, G. Wang, H. Shi, J. Shen, H. K. Ji and G. S. Kil, "Green gas for grid as an eco-friendly alternative insulation gas to SF6: A review," Applied Sciences (Switzerland), vol. 10, No. 7, pp. 1-13, Published: Apr. 7, 2020.

J. G. Owens, "Greenhouse gas emission reductions through use of a sustainable alternative to SF6," 34th Electrical Insulation Conference, EIC 2016, pp. 535-538, Accepted Nov. 23, 2019.

Y. Li, X. Zhang, J. Zhang, H. Cui, Y. Zhang, D. Chen, S. Xiao and J. Tang, "Thermal decomposition properties of fluoronitriles-N2 gas mixture as alternative gas for SF6," Journal of Fluorine Chemistry, vol. 229, 2016 Electrical Insulation Conference (EIC), Montréal, Qc, Canada, Jun. 19-22, 2016, 4 pp.

Y. Li, X. Zhang, Q. Chen, J. Zhang, Y. Li, S. Xiao and J. Tang, "Influence of oxygen on dielectric and decomposition properties of C4F7N-N2-O2 mixture," IEEE Transactions on Dielectrics and Electrical Insulation, vol. 26, No. 4, IEEE Transactions on Dielectrics and Electrical Insulation vol. 26, No. 4; Aug. 2019, pp. 1279-1286.

European Patent Office, "International Search Report and Written Opinion" for corresponding International (PCT) Patent Application No. PCT/EP2022/025428, dated Jan. 20, 2023, 12 pp.

\* cited by examiner

LOW VOLTAGE MEMS RELAY FILLED WITH ALTERNATIVE GAS MIXTURE TO SF$_6$

BACKGROUND

Field

The disclosed concept relates generally to electrical relays and in particular, electrical relays used to detect fault conditions in circuit interrupters.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Referring to FIG. 1, circuit interrupters such as circuit interrupter 1 are structured to be electrically connected between a power source 2 and a load 3 via line and neutral conductors 4, 6. Circuit interrupters typically include separable electrical contacts 8, which operate as a switch. When the separable contacts 8 are in contact with one another in a closed state, current is able to flow through any circuits connected to the circuit interrupter. When the separable contacts 8 are in an open state and not in contact with one another, current is prevented from flowing through any circuits connected to the circuit interrupter. The separable contacts 8 may be operated either manually by way of an operator handle, remotely by way of an electrical signal, or automatically in response to a detected fault condition. Typically, such circuit interrupters include an operating mechanism 10 with an actuator designed to rapidly close or open the separable contacts 8, and a trip mechanism 12, such as an electronic trip unit, which detects a number of fault conditions to trip the separable contacts 8 open automatically using the actuator. Trip mechanism 12 may, for example, use a current sensor 16 to monitor the current flowing through the line conductor 4. Upon detecting a fault condition, the electronic trip unit 12 trips the actuator to move the separable contacts 8 to their open position.

The separable contacts 8 may be part of a relay 14 that comprises an electromagnet (not shown or numbered in the figure) in addition to the separable contacts 8, wherein the electromagnet is configured to cause the separable contacts 8 to open upon detection of a fault-level current. In one example, the electronic trip unit 12 may supply a current to the relay electromagnet that causes the electromagnet to open the separable contacts 8.

Modern advancements have led to traditional electromechanical components (e.g. electromagnets and separable contacts) of relays and other circuit interrupter components being replaced with microelectromechanical systems (MEMS) parts. While MEMS have obvious advantages such as occupying significantly less space than traditionally-sized electromechanical components, it will be appreciated that using components on the scale of microns naturally raises issues with respect to prevention of short circuiting, arcing, and other malfunctions that arise from components being situated in very close proximity to one another. For example, if proper precautions are not taken, unintended arcing is more likely to occur when two relay contacts are separated by a distance on the scale of micrometers in a MEMS relay rather than millimeters (as is typical with traditional electromechanical relay components), and faster breakdown of the electrical contacts leading to increased contact resistance is a natural consequence of such unintended arcing.

There is thus room for improvement within MEMS protective relays in circuit interrupters.

SUMMARY

These needs and others are met by embodiments of the disclosed concept in which interfacing surfaces of the electrical contacts of a MEMS relay for a circuit interrupter are coated with a thin layer of liquid metal, and the MEMS relay is disposed in a sealed enclosure containing a gas medium. The gas medium is an alternative to sulfur hexafluoride (SF$_6$), prevents oxidation of the liquid metal coating the relay contacts, and has sufficient dielectric strength in order to prevent current flow during separation of the contacts.

In accordance with one aspect of the disclosed concept, a protective relay for a circuit interrupter is in electrical communication with a line conductor of the circuit interrupter and is operatively coupled to a trip unit of the circuit interrupter, and includes: a fault detection component structured to detect current flowing through the line conductor of the circuit interrupter, a gas tight sealed enclosure structured to isolate components within the sealed enclosure from an environment exterior to the sealed enclosure, a plurality of switch contacts coated with a liquid metal and enclosed within the sealed enclosure, and a gas mixture contained within the sealed enclosure such that the gas cannot diffuse to an environment exterior to the sealed enclosure and substances in the exterior environment cannot diffuse into the sealed enclosure. The fault detection component is structured to cause the trip unit to cause a pair of separable contacts of the circuit interrupter to open upon detection of a fault condition in the line conductor by the fault detection component, and the gas mixture comprises at least one of a number of anti-oxidation gases including nitrogen (N2), helium (He), neon (Ne), argon (Ar), and xenon (Xe).

In accordance with another aspect of the disclosed concept, a protective microelectromechanical system (MEMS) relay for a circuit interrupter is in electrical communication with a line conductor of the circuit interrupter and is operatively coupled to a trip unit of the circuit interrupter, and includes: a fault detection component structured to detect current flowing through the line conductor of the circuit interrupter, a gas tight sealed enclosure structured to isolate components within the sealed enclosure from an environment exterior to the sealed enclosure, a plurality of switch contacts coated with a liquid metal and enclosed within the sealed enclosure, and a gas mixture contained within the sealed enclosure such that the gas cannot diffuse to an environment exterior to the sealed enclosure and substances in the exterior environment cannot diffuse into the sealed enclosure. The fault detection component is structured to cause the trip unit to cause a pair of separable contacts of the circuit interrupter to open upon detection of a fault condition in the line conductor by the fault detection component, and is also structured such that each of an opening and a closing of the MEMS relay switch contacts takes between 10 microseconds and 200 microseconds. The gas mixture comprises at least one of a number of anti-oxidation gases including nitrogen (N2), helium (He), neon (Ne), argon (Ar), and xenon (Xe).

In accordance with another aspect of the disclosed concept, a circuit interrupter structured to be disposed between a power source and an electrical load includes: a pair of separable contacts structured such that closing the separable contacts connects the electrical load to the power source and opening the separable contacts isolates the electrical load from the power source, an operating mechanism operatively coupled to the separable contacts and structured to open and close the separable contacts, a trip mechanism operatively coupled to the operating mechanism and structured to actuate the operating mechanism, and a protective microelectromechanical system (MEMS) relay in electrical communication with a line conductor of the circuit interrupter and operatively coupled to the trip mechanism. The MEMS relay includes: a fault detection component structured to detect current flowing through the line conductor of the circuit interrupter, a gas tight sealed enclosure structured to isolate components within the sealed enclosure from an environment exterior to the sealed enclosure, a plurality of switch contacts coated with a liquid metal and enclosed within the sealed enclosure, and a gas mixture contained within the sealed enclosure such that the gas cannot diffuse to an environment exterior to the sealed enclosure and substances in the exterior environment cannot diffuse into the sealed enclosure. The fault detection component is structured to cause the trip unit to cause a pair of separable contacts of the circuit interrupter to open upon detection of a fault condition in the line conductor by the fault detection component, and is also structured such that each of an opening and a closing of the MEMS relay electrical contacts takes between 10 microseconds and 200 microseconds. The gas mixture comprises at least one of a number of anti-oxidation gases including nitrogen (N2), helium (He), neon (Ne), argon (Ar), and xenon (Xe).

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
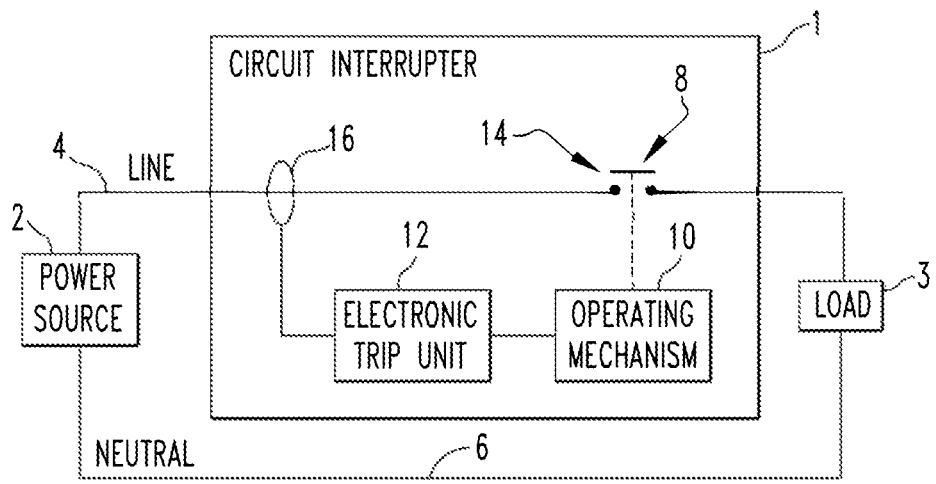
FIG. 1 is a schematic diagram of a known circuit interrupter.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

As used herein, the singular form of "a", "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

As used herein, the term "anti-oxidation gases" shall refer to a specific group of gases comprising nitrogen ($N_2$), helium (He), neon (Ne), argon (Ar), and xenon (Xe).

As used herein, the term "number" shall mean one or an integer greater than one (i.e., a plurality).

Figure 2A:
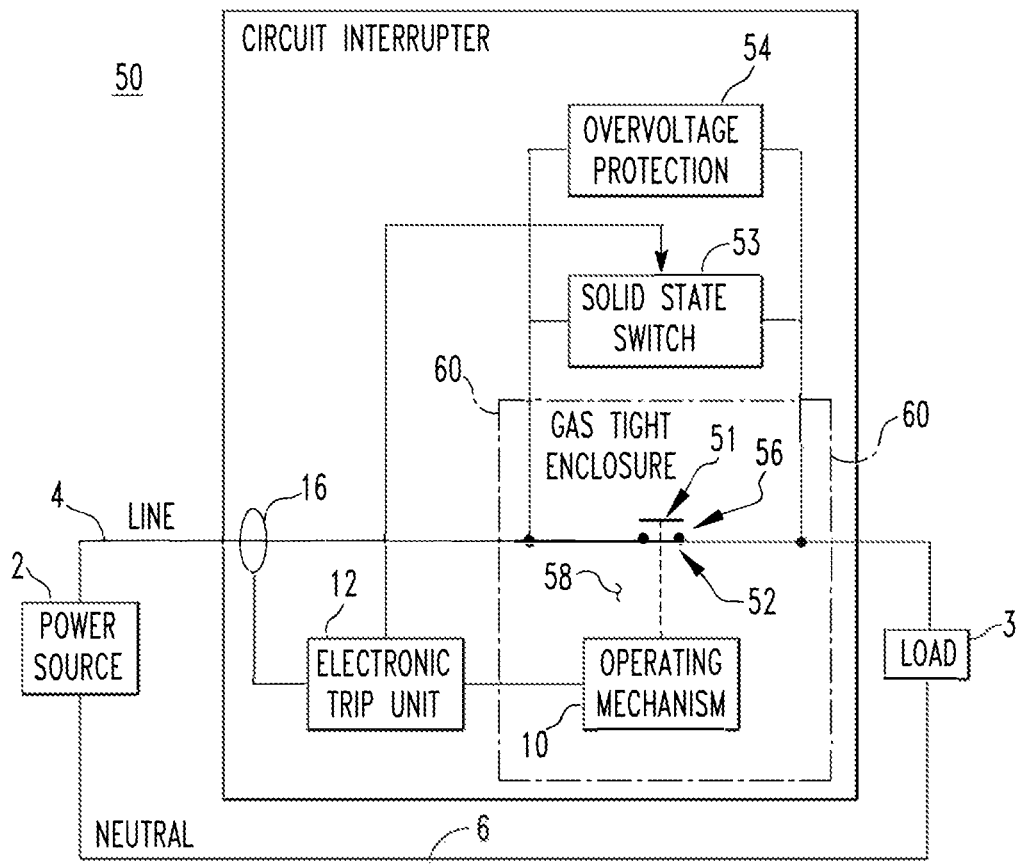
FIG. 2A is a schematic diagram of a hybrid circuit interrupter including a MEMS bypass relay, in accordance with an example embodiment of the disclosed concept.
Figure 2B:
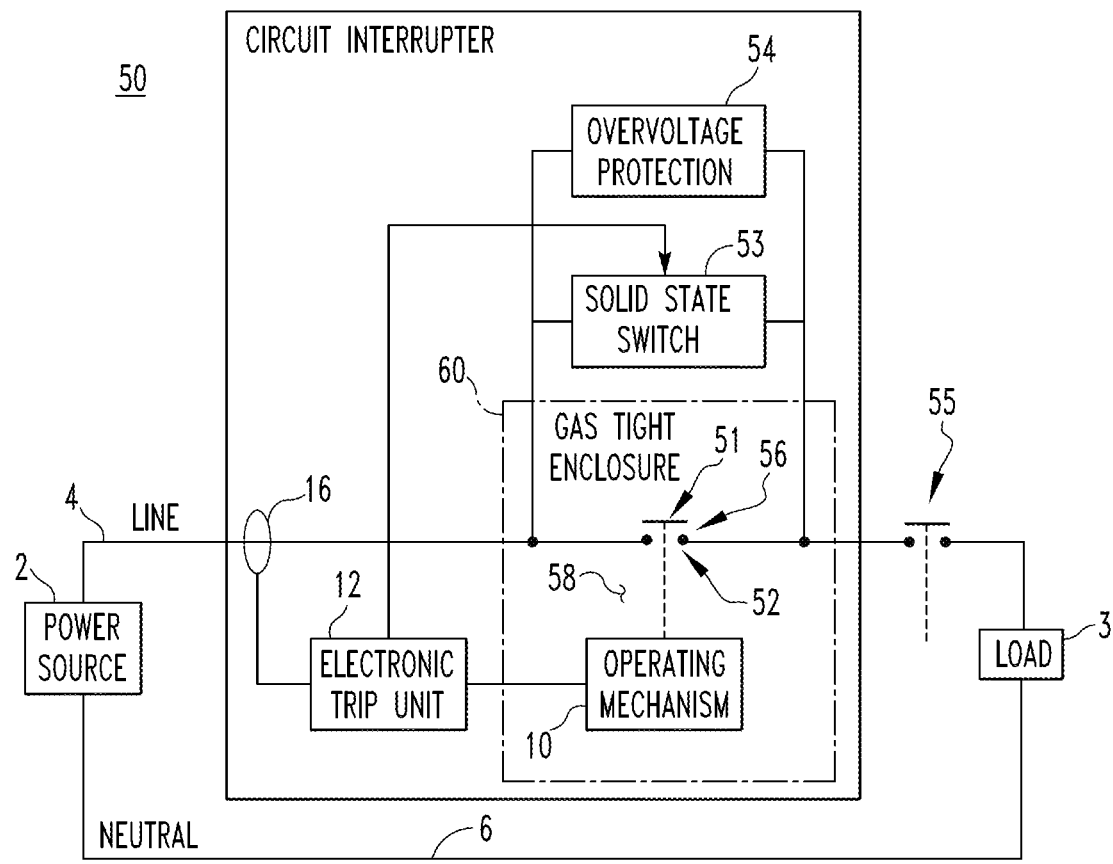
FIG. 2B is a schematic diagram of a hybrid circuit interrupter including both a MEMS bypass relay and an insulating relay, in accordance with an example embodiment of the disclosed concept.

Referring now to FIG. 2A, a hybrid circuit interrupter 50 according to an exemplary embodiment of the disclosed concept is shown. Circuit interrupter 50 comprises several of the same components as circuit interrupter 1 shown in FIG. 1; however, circuit interrupter 50 includes a MEMS bypass relay 51, in which the MEMS relay switch contacts 52 are sealed in an enclosure containing a dielectric gas medium (as described in more detail herein), instead of a relay with traditional electromechanical components such as relay 14 (depicted in FIG. 1). In addition, circuit interrupter 50 is a hybrid circuit interrupter that includes a solid state switch 53 and overvoltage protection 54 (such overvoltage protection may comprise, for example and without limitation, a varistor) connected in parallel with the MEMS bypass relay 51. Solid state switch 53 enables current to selectively commutate past the relay switch contacts 52 after the relay switch contacts 52 are opened in order to reduce/prevent arcing. FIG. 2B shows hybrid circuit interrupter 50 with an insulation relay 55 included.

Figure 3A:
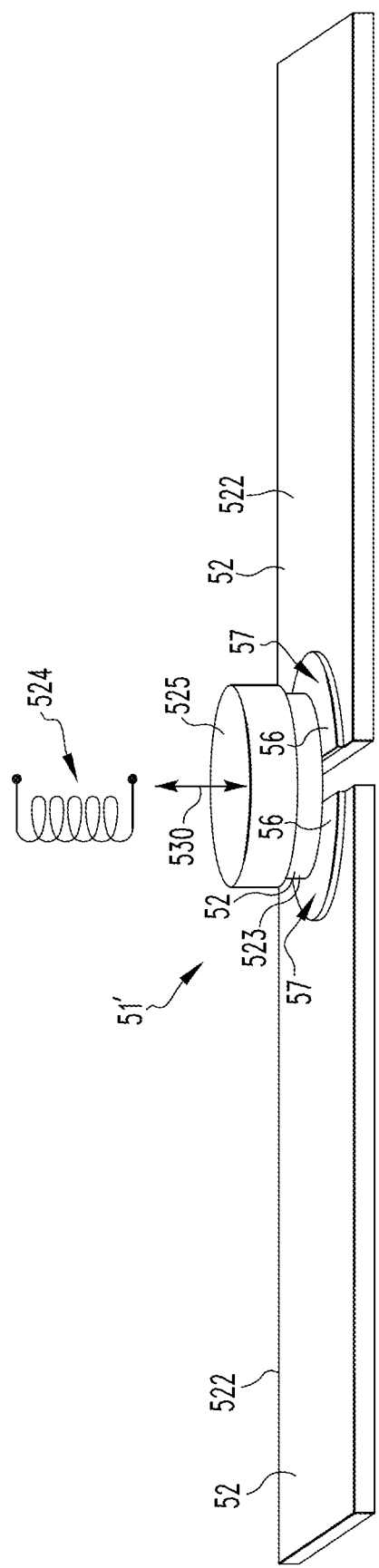
FIG. 3A is a perspective view of the interior components of a MEMS crossbar relay comprising two contact bars and a crossbar, in accordance with an example embodiment of the disclosed concept.
Figure 3B:
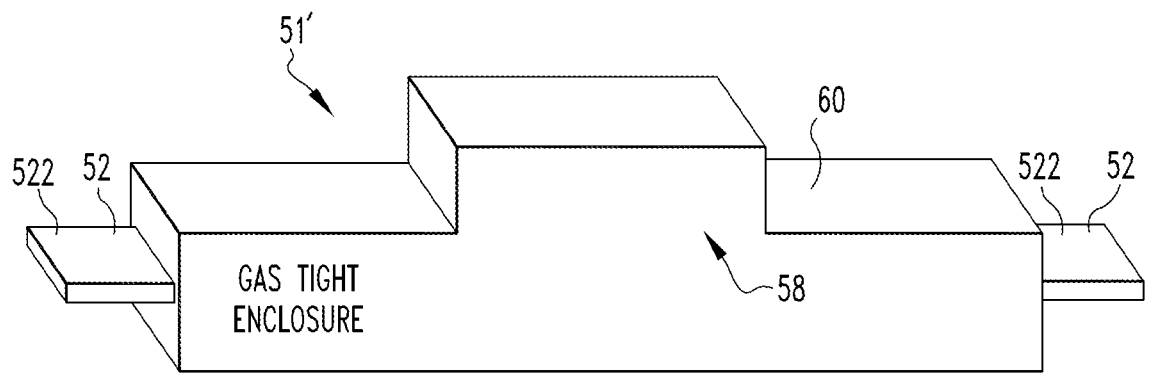
FIG. 3B is a perspective view of the exterior of the sealed enclosure containing the MEMS crossbar relay interior components shown in FIG. 3A, in accordance with an example embodiment of the disclosed concept.
Figure 4:
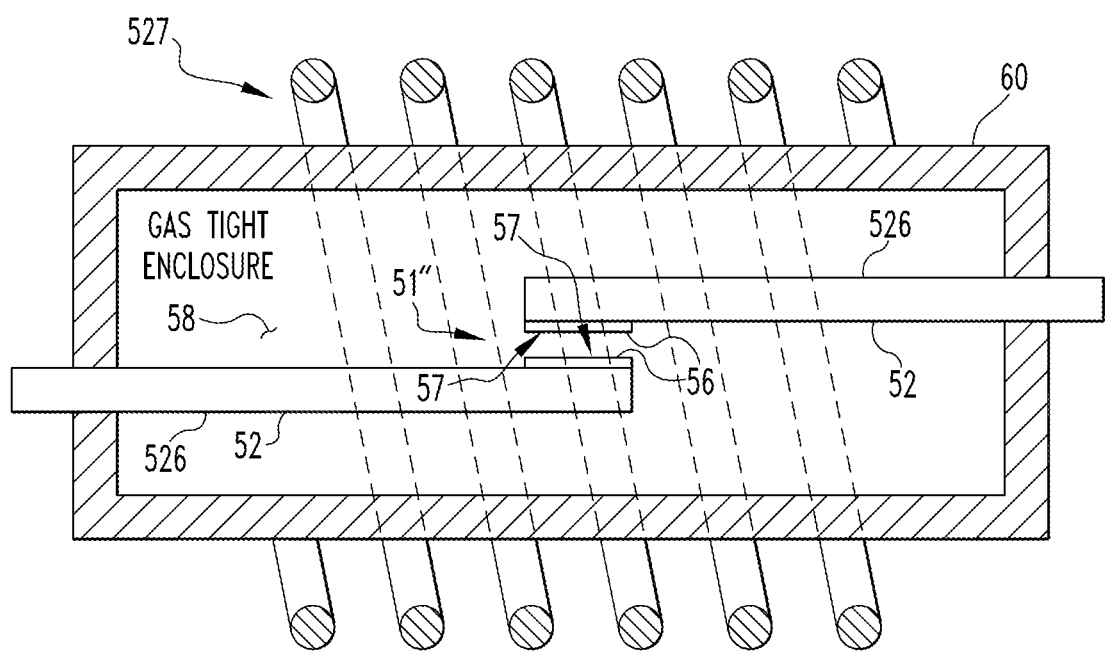
FIG. 4 is a sectional view of a MEMS reed relay, in accordance with an example embodiment of the disclosed concept.

Referring now to FIGS. 3A-3B and FIG. 4 in addition to FIGS. 2A-2B, it will be appreciated that several types of switches can be used in relays. While the relay switch contacts 52 included in FIGS. 2A-2B are schematically depicted separable contacts, the relay switch contacts 52 included in the MEMS crossbar relay 51' of FIG. 3A are two conductive contact bars 522 and a conductive crossbar 523 structured to be actuated by a conductive coil 524 acting on a permanent magnet 525 (as described in more detail herein), and the relay switch contacts 52 included in the MEMS reed relay 51" of FIG. 4 are two conductive reed contact bars 526 that are structured to be actuated by a conductive coil 527 (as described in more detail herein). It should be noted that either of MEMS crossbar relay 51' or MEMS reed relay 51" can be included in circuit interrupter 50 instead of MEMS bypass relay 51 without departing from the scope of the disclosed concept, and it will be appreciated that any components with the same reference numbers shown in more than one figure are the same or functionally equivalent in all of the figures in which they appear.

FIG. 3A shows the interior switching components of the MEMS crossbar relay 51', and FIG. 3B shows an exterior gas tight sealed enclosure 60 that encloses the interior components shown in FIG. 3A (enclosure 60 is described in more detail later herein). In addition to two contact bars 522 that are stationary, the crossbar relay 51' of FIGS. 3A-3B comprises a crossbar 523 and a permanent magnet 525. The crossbar 523 and permanent magnet 525 are coupled to another, and are structured to move up and down (relative to the view shown in FIG. 3A) as indicated by arrow 530 when an exterior electromagnetic field acts upon the permanent magnet 525. Said external electromagnetic field is generated when current is provided to and flows through the conductive coil 524. Coil 524 can either be disposed within the sealed enclosure 60 or externally to the sealed enclosure 60 without departing from the scope of the disclosed concept. When crossbar 523 is in contact with both contact bars 522 (as shown in FIG. 3A), crossbar relay 51' is in a closed state such that current can flow between the two crossbars 522 via the crossbar 523. Conversely, when crossbar 523 is not in contact both contact bars 522, crossbar relay 51' is in an open state such that current is prevented from flowing between the two crossbars 522.

FIG. 4 shows a sectional view of MEMS reed relay 51". Reed relay 51" comprises two reed contact bars 526 that are structured to move up and down (relative to the view shown in FIG. 4) between a closed state and an open state (the open state is shown in FIG. 4) when an electromagnetic field acts upon the two contact bars 526. Said external electromagnetic field is generated when current is provided to and flows through the conductive coil 527. Coil 527 is wrapped around the sealed enclosure 60 as depicted in FIG. 4. When the two contact bars 526 are in contact with one another, reed relay 51" is in the closed state and current can flow between the two contact bars 526. Conversely, when the two contact bars 526 are not in contact with one another, reed relay 51" is in an open state and current is prevented from flowing between the two contact bars 526.

Still referring to FIGS. 2A-4, in an exemplary embodiment of the disclosed concept, the circuit interrupter 50 is a low voltage breaker for use with up to 250 V AC and corresponding DC voltages. The MEMS relays 51, 51', 51" that can be included circuit interrupter 50 are designed to operate at fast speeds using low forces, such that opening and closing of the MEMS relay switch contacts 52 occurs on the scale of microseconds. In an exemplary embodiment of the disclosed concept, the time it takes to open or close the MEMS relay switch contacts 52 ranges from 10 µs to 200 µs. The fast speeds and low forces at which relays 51, 51', 51" can operate are possible due to the small size (approximately 0.15 mm thick) and light weight of the relay switch contacts 52, the small separation distance between the switch contacts 52 (approximately 20 µm to 200 µm), and the application of a thin layer (1 µm to 20 µm) of liquid metal 56 to the interfacing surfaces 57 of the switch contacts 52 that come into contact with one another upon closing of the switch contacts 52 (the term "interfacing surfaces" is explained in more detail herein below). Standard switching devices typically have contact resistance that either limits the let-through current (such as MEMS relays used as RF switches) or call for bulky contact solutions with high contact forces and relatively slow opening (as is the case with relays such as relay 14 in FIG. 1). Coating the MEMS relay interfacing surfaces 57 with liquid metal 56 in accordance with the disclosed concept prevents both of these typical issues from occurring by ensuring full area contact between the interfacing surfaces 57.

Each of the relays shown in FIGS. 2A-4 comprises a plurality of relay switch contacts 52, and it will be appreciated that each type of relay switch contact 52 shown in the figures (i.e. contact bars 522 and crossbar 523 in FIG. 3A, and reed contact bars 526 in FIG. 4) comprises a number of interfacing surfaces 57 that contacts the corresponding interfacing surfaces 57 of the other relay switch contacts 52 in the relay when the switch contacts 52 are closed. It will also be appreciated that only the interfacing surfaces 57 of the relay switch contacts 52 need to be coated with the liquid metal 56, as opposed to the entirety of the exterior surfaces of the switch contacts 52. However, for the sake of brevity, the relay switch contacts 52 may be referred to herein as being coated with the liquid metal 56, and it should be understood that the terms "coat", "coated", and "coating" as used in conjunction with the liquid metal 56 and the relay switch contacts 52 denotes that only the interfacing surfaces 57 of the relay switch contacts 52 need to be coated with the liquid metal 56, as opposed to the entire surface areas of the relay switch contacts 52. In addition, at an interface where two interfacing surfaces 57 meet, it is sufficient to coat only one of the interfacing surfaces 57 rather than both interfacing surfaces. In FIG. 3A, for example, it will be appreciated that the surface of crossbar 523 that faces and contacts the interfacing surfaces 57 of the contact bars 522 is the interfacing surface 57 of crossbar 523 (said interfacing crossbar 57 of crossbar 523 is not visible in FIG. 3B and is not numbered in the figure). The interfacing surface 57 of the crossbar 523 need not be coated with the liquid metal 56, as coating only the interfacing surfaces 57 of the contact bars 52 is sufficient for proper functioning of the relay 51'.

Contact resistance in traditional relays often arises as the result of there being limited areas of true contact at an interface between the relay contacts and/or the presence of resistive surface films or oxide layers. As described in more detail herein, the liquid metal 56 used to coat MEMS relay interfacing surfaces 57 and the gas mixture 58 used to fill the sealed MEMS relays 51, 51', 51" are chosen specifically in order to prevent the growth of resistance surface films or oxide layers on the relay switch contacts 52. The full area contact between interfacing surfaces 57 afforded by coating each of the switch contacts 52 with liquid metal 56 lowers resistance and contact heating, and tests have shown that up to 30 A of current can flow through switch contacts 52 without contact overheating and damage. It is expected that adjustments to the parameters of relay systems produced in accordance with the disclosed concept would facilitate the flow of higher magnitude currents.

Continuing to refer to FIGS. 2A-4, in exemplary embodiments of the disclosed concept, the liquid metal 56 used to coat the MEMS relay switch contacts 52 comprises one of a number of gallium alloys, as these gallium alloys exist in a liquid state from room temperature down to freezing temperatures. Three non-limiting examples of such alloys include gallium indide (GaIn), gallium stannide (GaSn), and an eutectic ternary alloy with the brand name Galinstan (Ga—In—Sn) that has a melting point of −19° C. In some example embodiments, other liquid metals and alloys such as Hg, and alloys of alkali metals Li, Na, K, Rb, and Cs may be used. Because the separation between the MEMS relay switch contacts 52 is so small in the open state, the contacts 52 need to operate in a gas medium 58 having sufficient dielectric strength in order to ensure that no current flows between the relay switch contacts 52 when the contacts 52 are separated. In addition, the gas medium 58 should not oxidize the liquid metal 56 coating the contacts 52. Therefore, air cannot be used as a medium. Hence, the gas tight sealed enclosure 60 of MEMS relays 51, 51', 51" is used to enclose the relay switch contacts 52 and the gas medium 58. Furthermore, sealed enclosure 60 prevents diffusion between the interior of the sealed enclosure 60 and the environment exterior to the sealed enclosure 60, i.e. sealed enclosure 60 is structured to isolate components contained within the sealed enclosure 60 from the exterior environment.

A typical solution for preventing the oxidation of metal electrical contacts is using a sealed encapsulation either evacuated to pressure lower than 0.1 mbar or filled with an electronegative gas. Sulfur hexafluoride ($SF_6$) is one example of an electronegative gas used in some telecom relays to increase the dielectric strength and the applicable voltage in such a sealed encapsulation. $SF_6$ is used largely in high and medium voltage installations. While $SF_6$ is effective at preventing oxidation of metal, its release into the atmosphere should be avoided, as its global warming potential is 23,900 times higher than $CO_2$, and its lifetime exceeds 3,000 years. Accordingly, alternative gases to be used instead of $SF_6$ for preventing oxidation have been researched, particularly for high and medium voltage installations. Among these alternative gases, fluoroketone $C_5F_{10}O$ and fluoronitrile $C_3F_7CN$ have been validated experimentally to be the most promising. In their pure forms, both of these gases can condense at freezing conditions, so they are typically diluted with air ($N_2+O_2$) or $CO_2$, or sometimes with $CO_2+O_2$, when intended for use in high and medium voltage installations. Some research papers have also discussed fluoronitrile $C_3F_7CN$ mixed with $N_2$ for high and medium voltage applications. However, using these gas mixtures (i.e. mixing fluoroketone or fluoronitrile with any of the aforementioned combinations of $N_2$, $O_2$, and/or $CO_2$) as an alternative to $SF_6$ in order to seal the relay switch contacts 52 still carries a risk of oxidizing the liquid metal coating 56 and thereby resulting in the failure of MEMS relays 51, 51', 51".

The innovation of the disclosed MEMS relays 51, 51', 51" lies in coating the switch contacts 52 with a liquid gallium alloy as previously stated, as well as filling the sealed enclosure 60 of the MEMS relays 51, 51', 51" with either fluoroketone or fluoronitrile mixed with at least one other gas from a group including $N_2$, He, Ne, Ar, and Xe. The specific group of gases comprising $N_2$, He, Ne, Ar, and Xe is referred to hereinafter as "anti-oxidation gases". This specific combination of gases provides a highly dielectric medium for the gallium alloy-coated MEMS relay switch contacts 52 to operate in, while avoiding the risk of oxidation of the liquid metal coating 56 on the contacts 52. It will be appreciated that avoiding the use of $SF_6$ to prevent its release into the atmosphere is critical, and that providing alternative gases that exhibit highly dielectric properties without affecting the contact resistance of the MEMS relay switch contacts 52 is critical in prompting a switch away from $SF_6$.

In one exemplary embodiment of the disclosed system, the gas medium 58 used to fill sealed enclosure 60 comprises a mixture of fluoronitrile $C_3F_7CN$ and at least one of the anti-oxidation gases, such that at 20° C., the gas mixture 58 has a partial pressure of fluoronitrile between 0.05 bar and 0.50 bar and a total absolute pressure between 0.5 bar and 5.0 bar absolute. The optimum total absolute pressure for this particular gas mixture 58 is between 1.0 bar and 2.0 bar absolute. In another exemplary embodiment, the gas medium 58 used to fill sealed enclosure 60 comprises a mixture of fluoroketone $C_5F_{10}O$ and at least one of the anti-oxidation gases, such that at 20° C., the gas mixture 58 has a partial pressure of fluoroketone between 0.05 bar and 0.10 bar and a total absolute pressure between 0.5 bar and 5.0 bar absolute. The optimum total absolute pressure for this particular gas mixture 58 is between 1.0 bar and 2.0 bar absolute. Other liquid metals previously used in the relevant field to coat electrical switching components and other $SF_6$ alternative gas mixtures of sufficient dielectric strength previously used as mediums for such liquid metal-coated components have resulted in oxidation of the liquid metal coating. The systems described herein above in accordance with the disclosed concept simultaneously further all of the goals of eliminating $SF_6$ use, providing sufficient dielectric strength for liquid metal-coated relay contacts, and preventing oxidation of said relay contacts. While the disclosed concept has been described in terms of the specific application of circuit interrupter relay contacts used as a bypass relay and taking the form of either a crossbar relay or reed relay, it will be appreciated that the concepts applied herein can be applied to other electrical switching components, such as general AC and DC switches, without departing from the scope of the disclosed concept.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A protective relay for a circuit interrupter, the protective relay being configured to be in electrical communication with a line conductor of the circuit interrupter and being configured to be operatively coupled to a trip unit of the circuit interrupter, the protective relay comprising:
   a gas tight sealed enclosure structured to isolate components within the sealed enclosure from an environment exterior to the sealed enclosure;
   a plurality of switch contacts enclosed within the sealed enclosure, the plurality of switch contacts being configured to be actuated between a closed state and an open state by the trip unit, with at least one switch contact of the plurality of switch contacts being coated with a liquid metal; and
   a gas mixture contained within the sealed enclosure such that the gas mixture cannot diffuse to the environment exterior to the sealed enclosure and substances in the exterior environment cannot diffuse into the sealed enclosure,
   wherein the plurality of switch contacts are configured such that, in the closed state, power can flow through the line conductor, and in the open state, power is prevented from flowing through the line conductor,
   wherein the plurality of switch contacts are configured to be actuated to the open state by the trip unit upon detection of a fault condition, and
   wherein the gas mixture comprises at least one of a number of anti-oxidation gases including nitrogen ($N_2$), helium (He), neon (Ne), argon (Ar), and xenon (Xe).

2. The protective relay of claim 1, wherein the components of the protective relay are microelectromechanical system (MEMS) components.

3. The protective relay of claim 1, wherein the liquid metal comprises a gallium alloy.

4. The protective relay of claim 3, wherein the gallium alloy comprises either gallium indide (GaIn), gallium stannide (GaSn), or a ternary alloy Ga—In—Sn.

5. The protective relay of claim 1, wherein the gas mixture comprises fluoronitrile $C_3F_7CN$.

6. The protective relay of claim 5, wherein at 20° C., the gas mixture has a partial pressure of fluoronitrile $C_3F_7CN$ between 0.05 bar and 0.50 bar and a total absolute pressure between 0.5 bar and 5.0 bar absolute.

7. The protective relay of claim 1, wherein the gas mixture comprises fluoroketone $C_5F_{10}O$.

8. The protective relay of claim 7, wherein at 20° C., the gas mixture has a partial pressure of fluoroketone $C_5F_{10}O$ between 0.05 bar and 0.10 bar and a total absolute pressure between 0.5 bar and 5.0 bar absolute.

9. A protective microelectromechanical system (MEMS) relay for a circuit interrupter, the protective MEMS relay being configured to be in electrical communication with a line conductor of the circuit interrupter and being configured to be operatively coupled to a trip unit of the circuit interrupter, the protective MEMS relay comprising:
a gas tight sealed enclosure structured to isolate components within the sealed enclosure from an environment exterior to the sealed enclosure;
a plurality of switch contacts enclosed within the sealed enclosure, the plurality of switch contacts being configured to be actuated between a closed state and an open state by the trip unit, with at least one switch contact of the plurality of switch contacts being coated with a liquid gallium alloy coating; and
a gas mixture contained within the sealed enclosure such that the gas mixture cannot diffuse to the environment exterior to the sealed enclosure and substances in the exterior environment cannot diffuse into the sealed enclosure,
wherein the plurality of switch contacts are configured such that, in the closed state, power can flow through the line conductor, and in the open state, power is prevented from flowing through the line conductor,
wherein the plurality of switch contacts are configured to be actuated to the open state by the trip unit upon detection of a fault condition,
wherein the protective MEMS relay is structured such that each of an opening and a closing of the plurality of switch contacts takes between 10 microseconds and 200 microseconds, and
wherein the gas mixture comprises at least one of a number of anti-oxidation gases including nitrogen ($N_2$), helium (He), neon (Ne), argon (Ar), and xenon (Xe).

10. The protective MEMS relay of claim 9, wherein a thickness of the liquid gallium alloy coating ranges between 1 micrometer and 20 micrometers.

11. The protective MEMS relay of claim 9, wherein the maximum thickness of each protective MEMS relay switch contact is 0.15 millimeters.

12. The protective MEMS relay of claim 9, wherein the protective MEMS relay is structured such that, when the plurality of switch contacts are in the open state, a separation distance between each switch contact relative to every other switch contact ranges between 20 micrometers and 200 micrometers.

13. The protective MEMS relay of claim 9,
wherein the gas mixture comprises fluoronitrile $C_3F_7CN$, and
wherein at 20° C., the gas mixture has a partial pressure of fluoronitrile $C_3F_7CN$ between 0.05 bar and 0.50 bar and a total absolute pressure between 0.5 bar and 5.0 bar absolute.

14. The protective MEMS relay of claim 9,
wherein the gas mixture comprises fluoroketone $C_5F_{10}O$, and
wherein at 20° C., the gas mixture has a partial pressure of fluoroketone $C_5F_{10}O$ between 0.05 bar and 0.10 bar and a total absolute pressure between 0.5 bar and 5.0 bar absolute.

15. A circuit interrupter structured to be disposed between a power source and an electrical load, the circuit interrupter comprising:
a line conductor configured to be electrically connected between a power source and a load;
a plurality of switch contacts configured such that, in the closed state, power can flow through the line conductor from the power source to the load, and in the open state, power is prevented from flowing through the line conductor from the power source to the load;
an operating mechanism operatively coupled to the plurality of switch contacts and structured to open and close the plurality of switch contacts;
a trip mechanism operatively coupled to the operating mechanism and structured to actuate the operating mechanism;
a fault detection component configured to detect fault conditions in the circuit interrupter and to communicate with the trip mechanism; and
a protective microelectromechanical system (MEMS) relay, the protective MEMS relay being in electrical communication with the line conductor and operatively coupled to the trip mechanism, the protective MEMS relay comprising:
a gas tight sealed enclosure structured to isolate components within the sealed enclosure from an environment exterior to the sealed enclosure;
the plurality of switch contacts, with the plurality of switch contacts being enclosed within the sealed enclosure, and with at least one switch contact of the plurality of switch contacts being coated with a liquid gallium alloy coating; and
a gas mixture contained within the sealed enclosure such that the gas mixture cannot diffuse to the environment exterior to the sealed enclosure and substances in the exterior environment cannot diffuse into the sealed enclosure,
wherein the plurality of switch contacts are configured to be actuated to the open state by the trip unit upon detection of a fault condition by the fault detection component,
wherein the protective MEMS relay is structured such that each of an opening and a closing of the plurality of switch contacts takes between 10 microseconds and 200 microseconds, and
wherein the gas mixture comprises at least one of a number of anti-oxidation gases including nitrogen ($N_2$), helium (He), neon (Ne), argon (Ar), and xenon (Xe).

16. The circuit interrupter of claim 15, wherein the circuit interrupter is rated for use with up to 250 V AC and corresponding DC voltages.

17. The circuit interrupter of claim 15,
wherein a thickness of the liquid gallium alloy coating ranges between 1 micrometer and 20 micrometers, and
wherein the maximum thickness of each MEMS relay switch contact is 0.15 millimeters.

18. The circuit interrupter of claim 15,
wherein the maximum thickness of each switch contact is 0.15 millimeters,
wherein the protective MEMS relay is structured such that, when the plurality of switch contacts are in the open state, a separation distance between each switch contact relative to every other switch contact ranges between 20 micrometers and 200 micrometers.

19. The circuit interrupter of claim 15,
wherein the gas mixture comprises fluoronitrile $C_3F_7CN$, and
wherein at 20° C., the gas mixture has a partial pressure of fluoronitrile $C_3F_7CN$ between 0.05 bar and 0.50 bar and a total absolute pressure between 0.5 bar and 5.0 bar absolute.

20. The circuit interrupter of claim 15,
wherein the gas mixture comprises fluoroketone $C_5F_{10}O$, and
wherein at 20° C., the gas mixture has a partial pressure of fluoroketone $C_5F_{10}O$ between 0.05 bar and 0.10 bar and a total absolute pressure between 0.5 bar and 5.0 bar absolute.

\* \* \* \* \*